United States Patent
Lai

(10) Patent No.: US 10,560,618 B2
(45) Date of Patent: Feb. 11, 2020

(54) ASSEMBLING METHOD OF CAMERA MODULE

(71) Applicant: Primax Electronics Ltd., Taipei (TW)

(72) Inventor: Kuo-Ming Lai, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 8 days.

(21) Appl. No.: 16/044,767

(22) Filed: Jul. 25, 2018

(65) Prior Publication Data
US 2019/0342475 A1 Nov. 7, 2019

(30) Foreign Application Priority Data
May 4, 2018 (TW) .............................. 107115289 A

(51) Int. Cl.
*H04N 5/225* (2006.01)

(52) U.S. Cl.
CPC ......... *H04N 5/2254* (2013.01); *H04N 5/2253* (2013.01); *H04N 5/2257* (2013.01); *H01L 2224/48227* (2013.01)

(58) Field of Classification Search
CPC .. H04N 5/2254; H04N 5/2253; H04N 5/2257; H04N 5/2258; H01L 2224/48227; H01H 2229/038; H05K 2201/05; H05K 3/361; H05K 1/028; H05K 1/189
See application file for complete search history.

(56) References Cited

U.S. PATENT DOCUMENTS

| | | | | |
|---|---|---|---|---|
| 2001/0055073 | A1* | 12/2001 | Shinomiya | H01L 27/14618 348/374 |
| 2002/0140837 | A1* | 10/2002 | Miyake | H04N 5/2253 348/340 |
| 2004/0021792 | A1* | 2/2004 | Yasui | H04N 5/2253 348/373 |
| 2004/0223072 | A1* | 11/2004 | Maeda | H01L 27/14618 348/340 |
| 2007/0120050 | A1* | 5/2007 | Sawahata | H01L 27/14618 250/239 |
| 2008/0170141 | A1* | 7/2008 | Tam | H04N 5/2251 348/294 |
| 2011/0262121 | A1* | 10/2011 | Yanagisawa | G02B 7/08 396/55 |
| 2013/0188030 | A1* | 7/2013 | Igarashi | A61B 1/051 348/65 |

(Continued)

FOREIGN PATENT DOCUMENTS

KR 101004873 B1 * 12/2010

*Primary Examiner* — Albert H Cutler
(74) *Attorney, Agent, or Firm* — Kirton McConkie; Evan R. Witt

(57) ABSTRACT

An assembling method of a camera module includes the following steps. Firstly, a sensing chip is installed on a strip-like substrate. Then, the strip-like substrate is bent, so that a bent substrate in a bent state is formed. Then, the bent substrate and an optical lens are placed on a fastening table and an alignment module, respectively. Then, an installation angle of the optical lens is adjusted by the alignment module according to an active alignment. Then, the optical lens and the bent substrate are combined together. After the bent substrate is restored from the bent state to a non-bent state, the camera module is produced. The assembling method is suitable for assembling the longer camera module.

9 Claims, 11 Drawing Sheets

(56) References Cited

U.S. PATENT DOCUMENTS

| | | | | |
|---|---|---|---|---|
| 2014/0111682 | A1* | 4/2014 | Flugge | G02B 7/08 348/345 |
| 2015/0077624 | A1* | 3/2015 | Havskjold | H05K 1/028 348/373 |
| 2015/0312457 | A1* | 10/2015 | Kojima | G02B 23/2484 348/76 |
| 2015/0370086 | A1* | 12/2015 | Hamada | G03B 5/00 359/557 |
| 2016/0241786 | A1* | 8/2016 | Minamisawa | G03B 5/00 |
| 2018/0070805 | A1* | 3/2018 | Kawayoke | H01L 27/14 |
| 2018/0255213 | A1* | 9/2018 | Ahn | B60R 1/00 |

* cited by examiner

ASSEMBLING METHOD OF CAMERA MODULE

FIELD OF THE INVENTION

The present invention relates to a camera module, and more particularly to a camera module for a portable electronic device.

BACKGROUND OF THE INVENTION

Recently, mobile communication devices, personal digital assistants (PDA) or other small-sized portable electronic devices with image-shooting functions are widely used. Since the portable electronic devices can be carried easily, the image-shooting functions become the basic functions of the portable electronic devices. In other words, the portable electronic device is equipped with a camera module.

The structure of a conventional camera module will be described as follows. FIG. 1 is a schematic top view illustrating a portion of a conventional camera module. As shown in FIG. 1, the camera module 1 comprises an optical lens 10, a sensing chip 11 and a substrate 12. The optical lens 10 is located over the sensing chip 11. After the ambient light beams pass through the optical lens 10, the ambient light beams are refracted to perform an imaging task. The sensing chip 11 is installed on the substrate 12. The sensing chip 11 has a sensing area 111. The optical lens 10 covers the range of the sensing area 111. When the ambient light beams passing through the optical lens 10 are imaged on the sensing area 111, an image is generated. The substrate 12 is electrically connected with a power source (not shown) of a portable electronic device (not shown). By acquiring the electric power from the power source, the camera module 1 is normally operated. In addition to the above components, the camera module 1 further comprises additional components. For example, according to the practical requirements, the camera module 1 further comprises a voice coil motor or an anti-vibration module. These additional components are not the subject of the present invention, and are not redundantly described herein.

Please refer to FIGS. 2 and 3. FIG. 2 is a schematic top view illustrating the conventional assembling device and the conventional camera module. FIG. 3 is a schematic perspective view illustrating a portion of a fastening table of the conventional assembling device and a portion of the conventional camera module. In FIG. 2, the structure of an assembling device 2 and the structure of the camera module 1 are shown. The assembling device 2 comprises a fastening table 21, an alignment module 22, an optical lens bracket 23, a sensing chip bracket 24 and plural substrate brackets 25. The alignment module 22 comprises plural alignment fixtures 221. After the camera module 1 is fixed on the fastening table 21, the process of assembling the camera module 1 is performed. It is noted that the assembling device 2 further comprises additional modules for assisting in assembling the camera module 1. For succinctness, these additional modules are not shown in FIG. 2.

The process of assembling the camera module 1 will be described as follows. Firstly, the sensing chip 11 is installed on the substrate 12. Then, the substrate 11 with the sensing chip 11 is placed on the fastening table 21. Then, the optical lens 10 is placed on the plural alignment fixtures 221 of the alignment module 22. Then, the plural alignment fixtures 221 are used to perform active alignment on the optical lens 10. Then, the optical lens 10 and the sensing chip 11 are combined together. After the above assembling process, the camera module 1 is fabricated.

With increasing development of science and technology, the user pays much attention to the image-shooting function of the portable electronic device. For example, the portable electronic device is usually equipped with a front camera module for taking self-portrait photos. Consequently, the demands of the user on the shooting efficacy of the front camera module (especially the pixel values) are gradually increased. For example, the front camera module with at least several ten millions of pixels is satisfactory to the user. However, the volume of the high-pixel front camera module is large. Moreover, the portable electronic device with the large-sized display panel is favored by most users. Since the large-sized display panel occupies a lot of inner space of the portable electronic device, it is difficult to install the high-pixel front camera module in the portable electronic device.

For solving the above drawbacks, the manufacturers produce and develop the camera modules with diverse shapes in order to evade the components of the portable electronic devices. Consequently, the camera module can be installed in the portable electronic device. However, some kinds of camera modules are not suitably assembled by the assembling device 2 because of their shapes. For example, since the strip-like camera module is very long, it is difficult to fix the strip-like camera module on the fastening table 21. Moreover, since the accommodation space of the assembling device 2 is limited, it is difficult to accommodate strip-like camera module within the assembling device 2. Under this circumstance, the camera module 1 cannot be successfully assembled.

Therefore, there is a need of providing an assembling method of a strip-like camera module.

SUMMARY OF THE INVENTION

An object of the present invention provides an assembling method of a strip-like camera module.

In accordance with an aspect of the present invention, there is provided an assembling method of a camera module. The assembling method includes the following steps. In a step (A), a sensing chip is installed on a strip-like substrate. A length of the strip-like substrate is larger than a length of a fastening table. In a step (B), the strip-like substrate is bent, so that a bent substrate in a bent state is formed. A length of the bent substrate is nearly equal to the length of the fastening table. In a step (C), the bent substrate is placed on the fastening table, and an optical lens is placed on an alignment module of an assembling device. In a step (D), an installation angle of the optical lens is adjusted by the alignment module according to an active alignment. In a step (E), the optical lens and the bent substrate are combined together. In a step (F), the bent substrate is restored from the bent state to a non-bent state, so that the camera module is produced.

In an embodiment, the step (B) includes steps (B1) and (B2). In the (B1), the strip-like substrate is bent at a bendable segment of the strip-like substrate. In the step (B2), a first region of the strip-like substrate and a second region of the strip-like substrate are partially stacked on each other, so that the bent substrate is formed.

From the above descriptions, the present invention provides the assembling method of the camera module. After the longer strip-like substrate is bent to be formed as the shorter bent substrate, the bent substrate is placed on the fastening table. Consequently, the active alignment on the optical lens is performed. After the active alignment is completed, the optical lens and the bent substrate are combined together. After the bent substrate is restored from the bent state to the non-bent state, the camera module completing the active alignment is produced. The assembling method of the present invention is capable of assembling the longer camera module in order to overcome the drawbacks of the conventional technologies.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technology, the present invention provides an assembling method of a camera module. The structure of the camera module of the present invention will be illustrated as follows.

Figure 1:
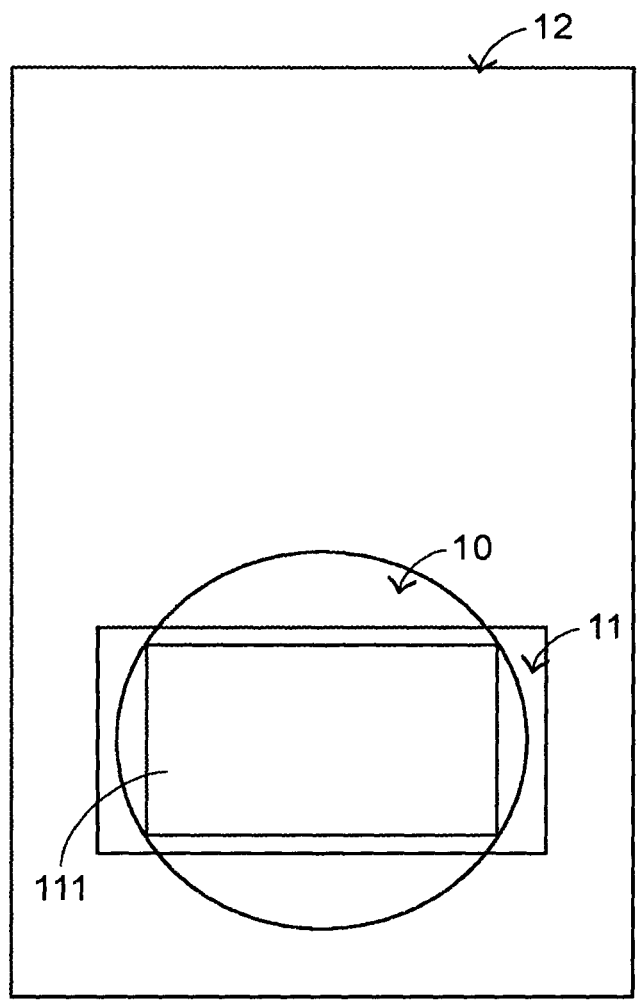
FIG. 1 is a schematic top view illustrating a portion of a conventional camera module.
Figure 2:
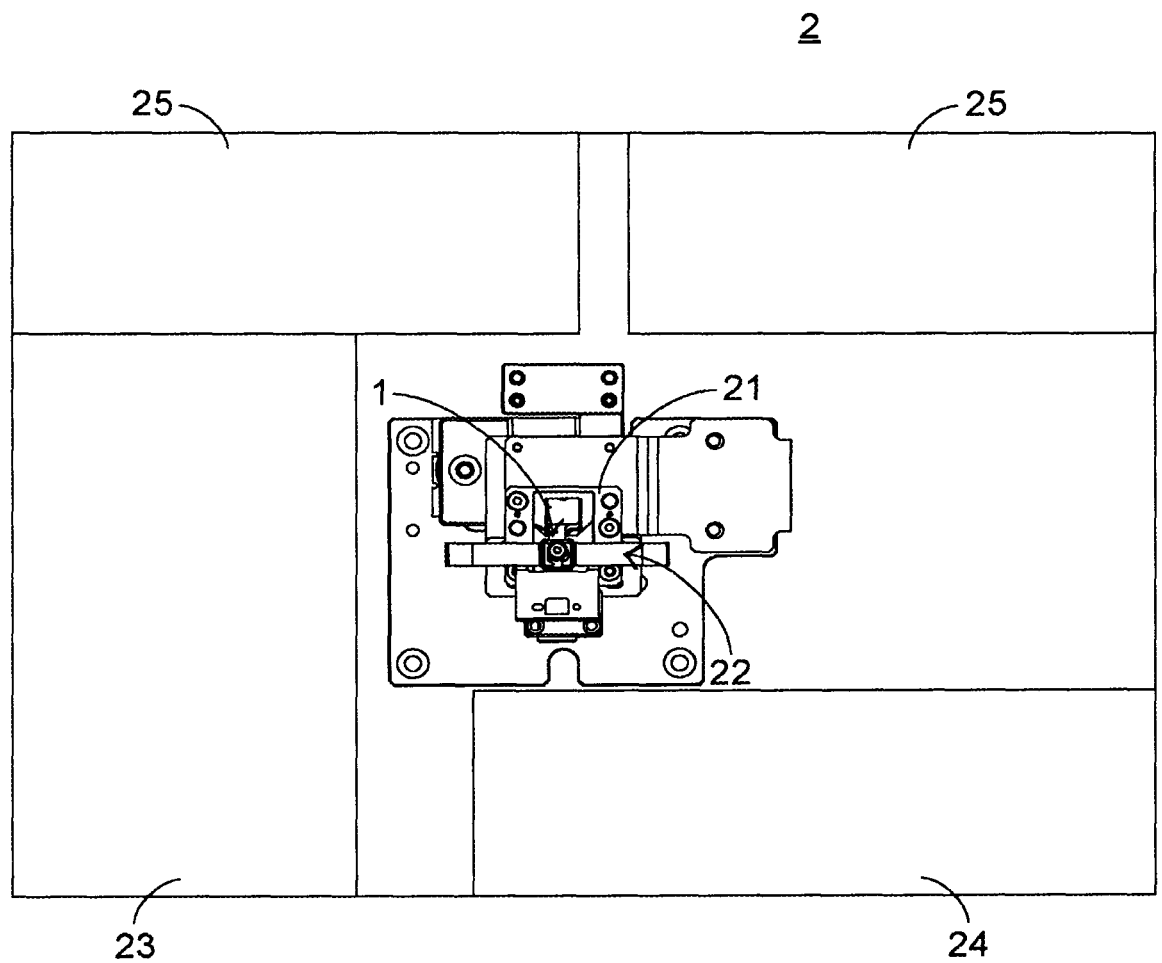
FIG. 2 is a schematic top view illustrating the conventional assembling device and the conventional camera module.
Figure 3:
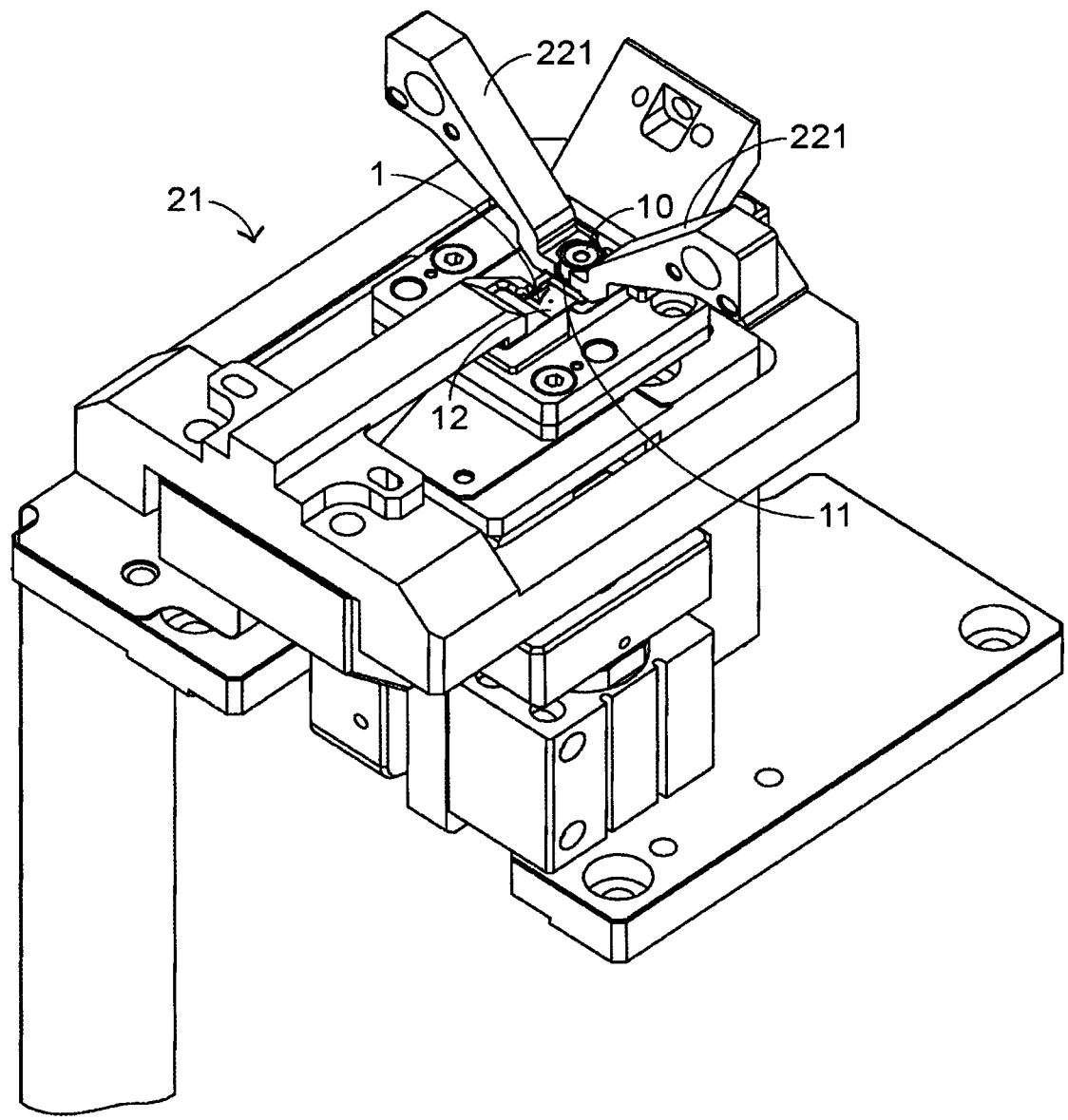
FIG. 3 is a schematic perspective view illustrating a portion of a fastening table of the conventional assembling device and a portion of the conventional camera module.
Figure 4:
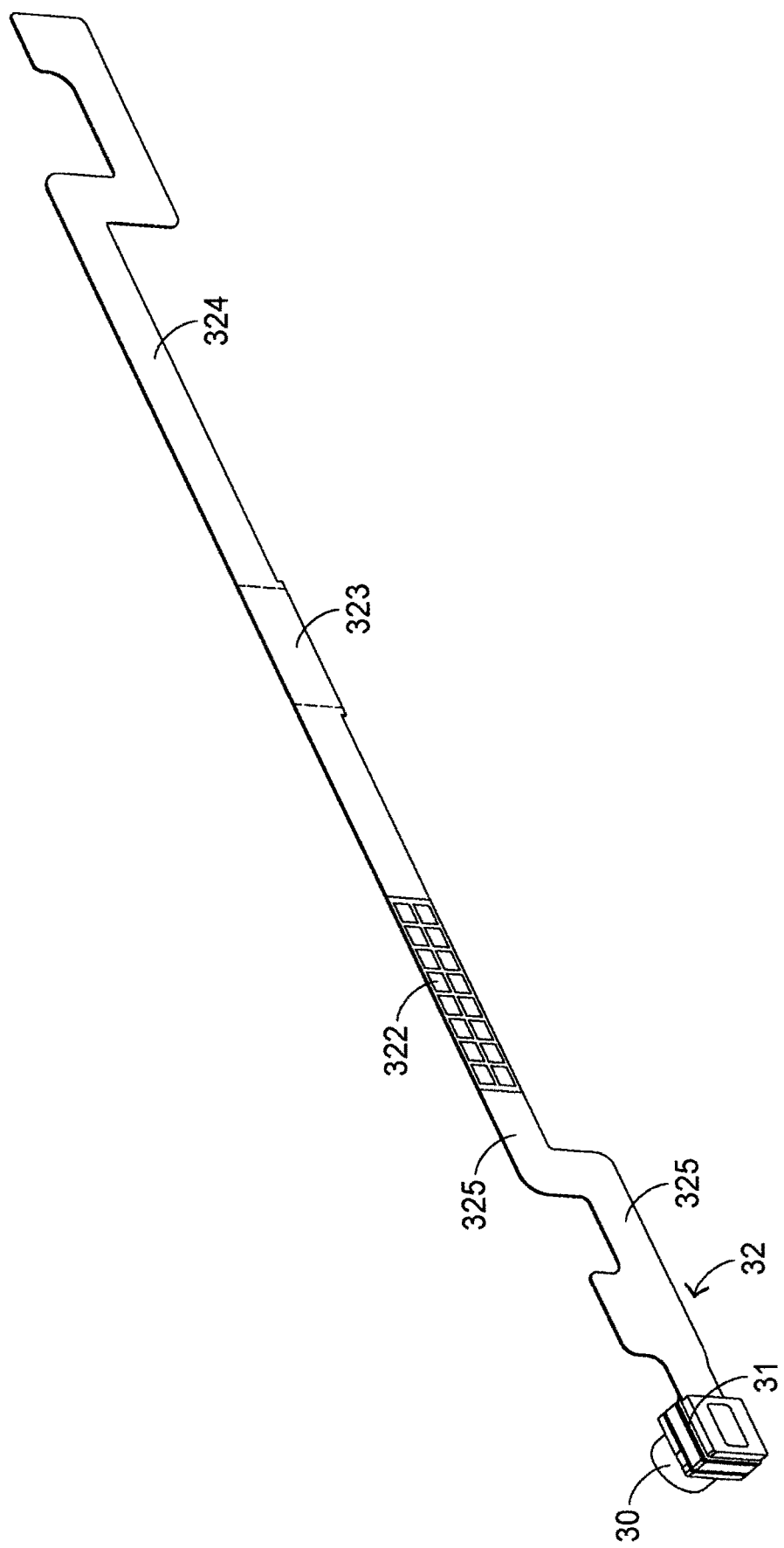
FIG. 4 is a schematic perspective view illustrating the structure of a camera module according to an embodiment of the present invention.

FIG. 4 is a schematic perspective view illustrating the structure of a camera module according to an embodiment of the present invention. As shown in FIG. 4, the camera module 3 comprises an optical lens 30, a sensing chip 31 and a strip-like substrate 32. The structures and functions of the optical lens 30 and the sensing chip 31 are similar to those of the conventional camera module, and are not redundantly described herein. In an embodiment, the strip-like substrate 32 comprises a main body 321, a first electric connection part 322 and a bendable segment 323. The first electric connection part 322 is disposed on a bottom surface of the main body 321. The bendable segment 323 is disposed on the main body 321. The bendable segment 323 is made of a flexible material. Consequently, the bendable segment 323 can be bent according to the practical requirements. The length of the strip-like substrate 32 is larger than the length of the substrate 12 of the conventional camera module. That is, the strip-like substrate 32 cannot be fixed on the fastening table 21 of the conventional assembling device.

Figure 5A:
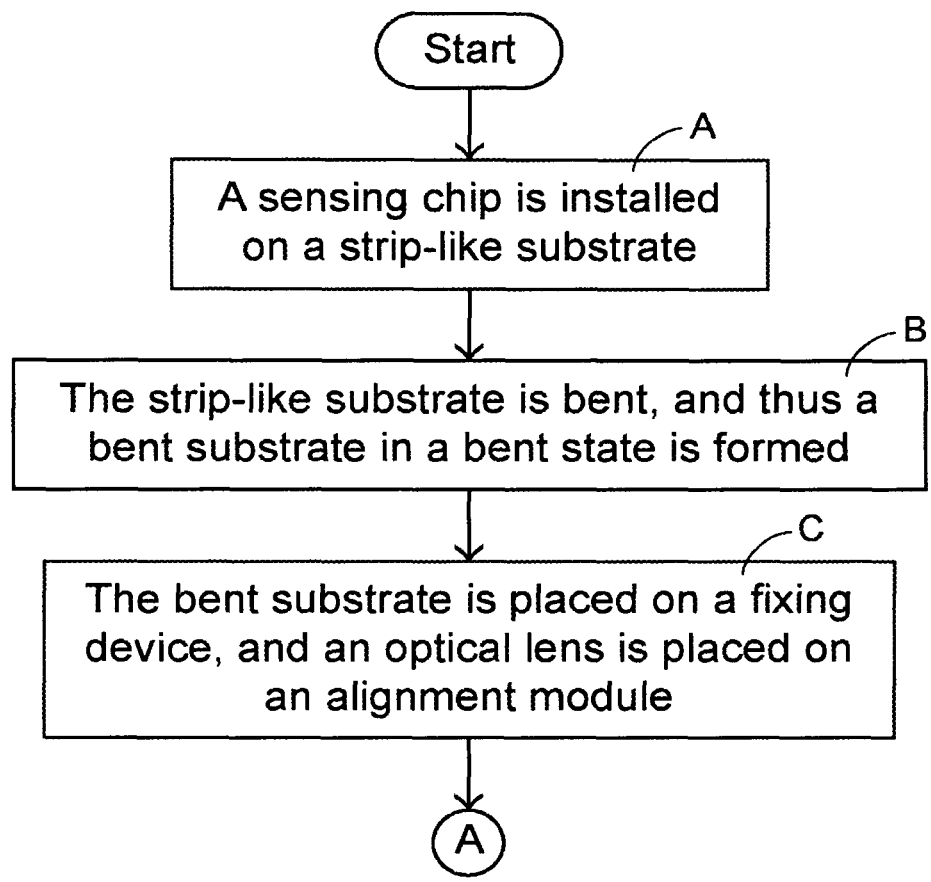
FIG. 5A and FIG. 5B are flowcharts illustrating an assembling method of a camera module according to an embodiment of the present invention.
Figure 5B:
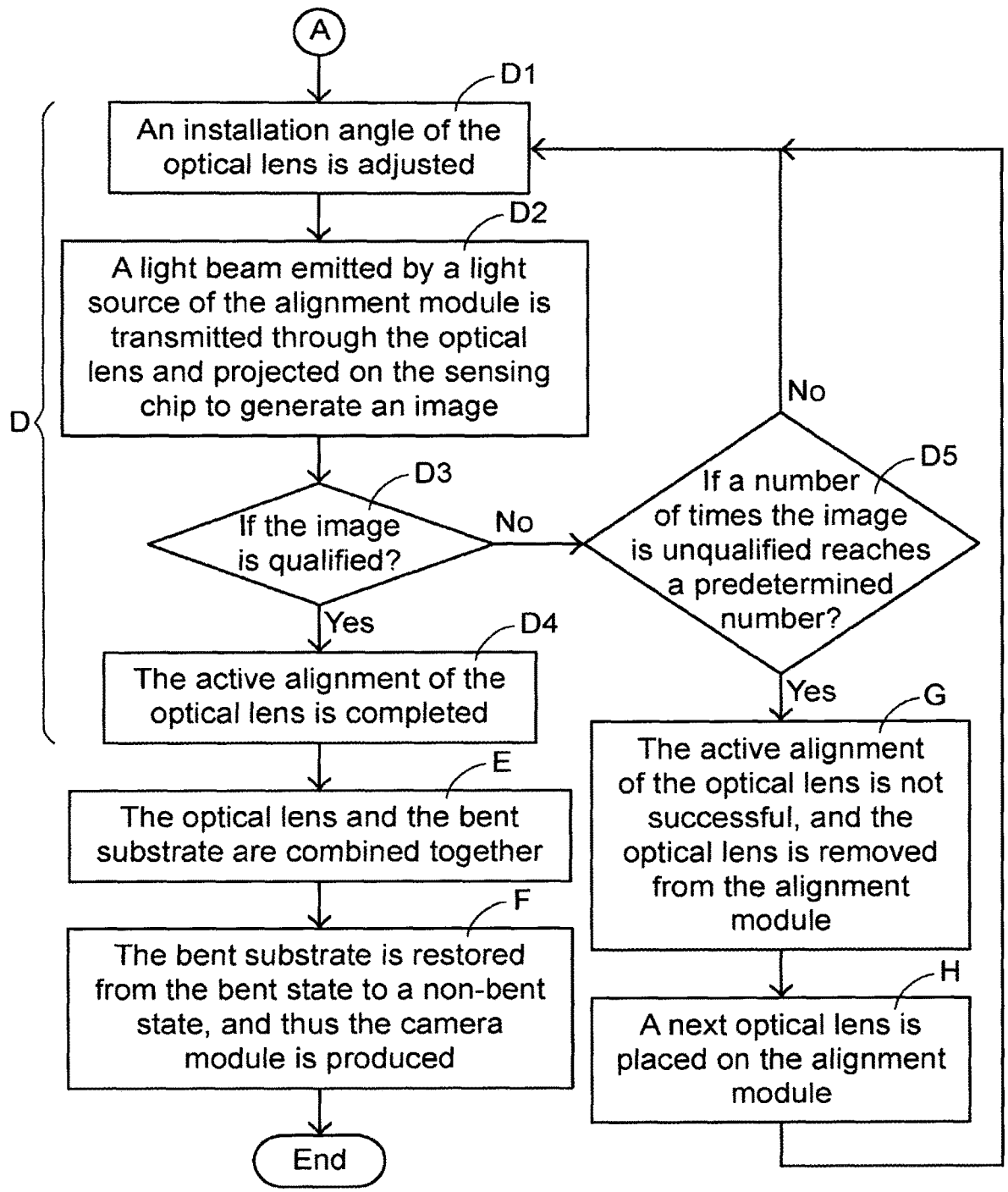

An assembling method of the camera module 3 will be illustrated as follows. FIG. 5A and FIG. 5B are flowcharts illustrating an assembling method of a camera module according to an embodiment of the present invention. The assembling method comprises the following steps.

In a step A, a sensing chip is installed on a strip-like substrate. In a step B, the strip-like substrate is bent, and thus a bent substrate in a bent state is formed. In a step C, the bent substrate and an optical lens are placed on a fastening table and an alignment module, respectively. In a step D, an installation angle of the optical lens is adjusted by the alignment module according to an active alignment. In a step G, the active alignment of the optical lens is not successful, and the optical lens is removed from the alignment module. In a step H, a next optical lens is placed on the alignment module. In a step E, the optical lens and the bent substrate are combined together. In a step F, the bent substrate is restored from the bent state to a non-bent state, and thus the camera module is produced.

The step D comprises steps D1, D2, D3, D4 and D5. In the step D1, the installation angle of the optical lens is adjusted. In the step D2, a light beam emitted by a light source of the alignment module is transmitted through the optical lens and projected on the sensing chip to generate an image. The step D3 is performed to judge whether the image is qualified. In the step D4, the active alignment of the optical lens is completed. The step D5 is performed to judge whether a number of times the image is unqualified reaches a predetermined number.

If the judging condition of the step D3 is satisfied, the step D4 is performed. Whereas, if the judging condition of the step D3 is not satisfied, the step D5 is performed. If the judging condition of the step D5 is satisfied, the step G is performed. Whereas, if the judging condition of the step D5 is not satisfied, the step D1 is repeatedly done. In an embodiment, the predetermined number is 3. It is noted that the value of the predetermined number is not restricted. That is, the value of the predetermined number may be set according to the practical requirements.

Figure 6:
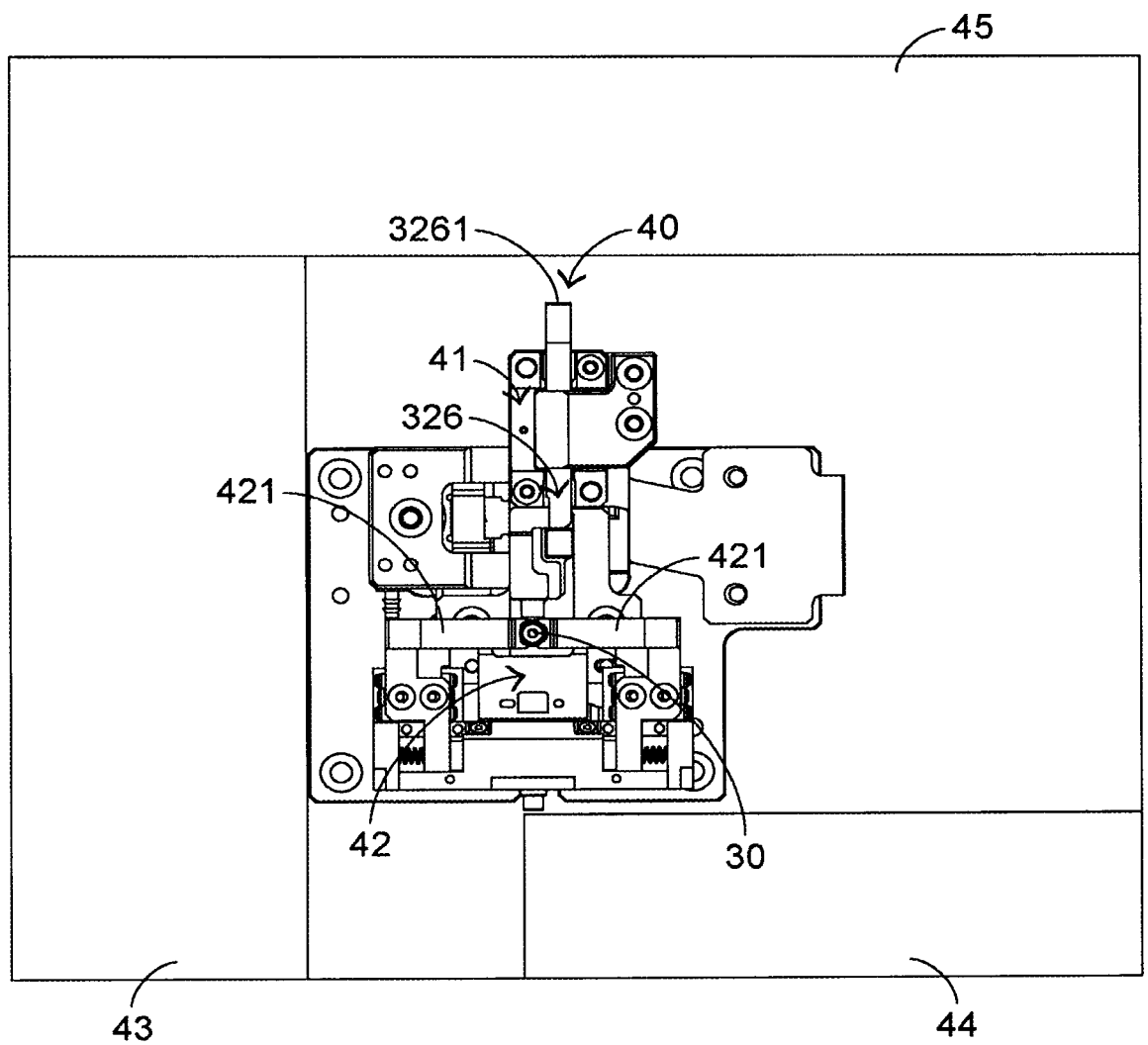
FIG. 6 is a schematic top view illustrating an assembling device for assembling the camera module of the present invention.
Figure 7:
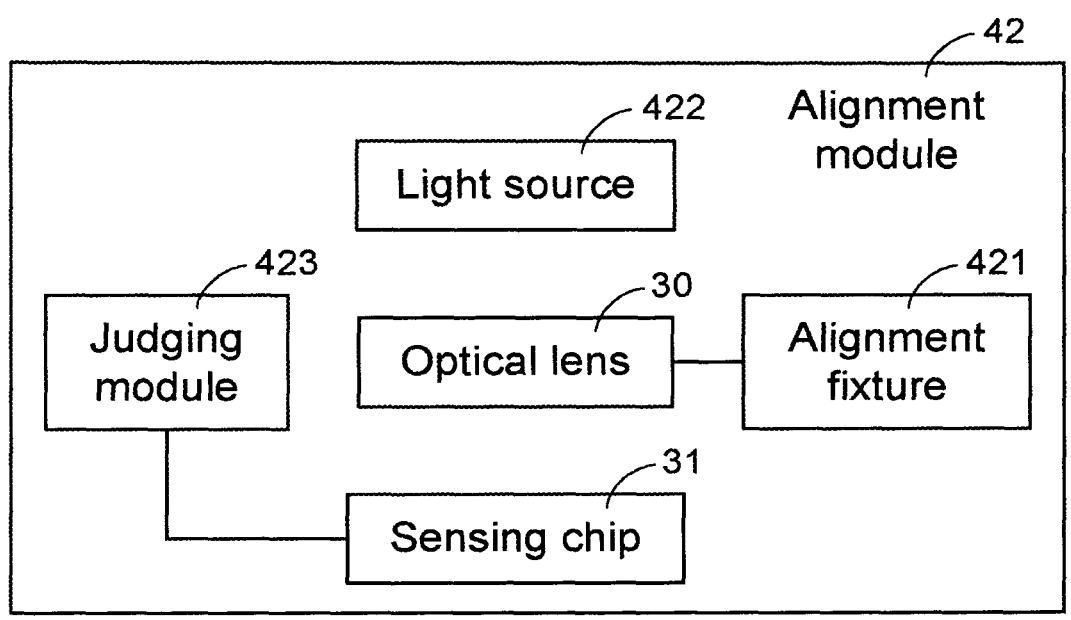
FIG. 7 schematically illustrates the architecture of an alignment module of the assembling device of the present invention.

An assembling device for performing the assembling device of the present invention will be illustrated with reference to FIGS. 6 and 7. FIG. 6 is a schematic top view illustrating an assembling device for assembling the camera module of the present invention. FIG. 7 schematically illustrates the architecture of an alignment module of the assembling device of the present invention. In FIG. 6, the structure of the assembling device 4 is shown. The assembling device 4 comprises a fastening table 41, an alignment module 42, an optical lens bracket 43, a sensing chip bracket 44 and a substrate bracket 45. In FIG. 7, the structure of the alignment module 42 is shown. The fastening table 41 is used for fixing the strip-like substrate 32. The alignment module 42 is used for performing an active alignment on the optical lens 30. While the active alignment is performed on the optical lens 30, the optical lens 30 is placed on the optical lens bracket 43. While a conductive adhesive film forming process is performed, the sensing chip 31 is placed on the sensing chip bracket 44. The strip-like substrate 32 is placed on the substrate bracket 45.

As shown in FIG. 7, the alignment module 42 comprises plural alignment fixtures 421, a light source 422 and a judging module 423. The alignment fixtures 421 are used for clamping the optical lens 30 and adjusting the installation position and the installation angle of the optical lens 30. The alignment module 42 further comprises a power element (not shown). The power element is connected with the alignment fixtures 421 to provide motive power to the alignment fixtures 421. Consequently, the alignment fixtures 421 is moved or rotated. The light source 422 emits a light beam. After the light beam passes through the optical lens 30, the light beam is imaged on the sensing chip 31 to produce an image. The image can assist in the active alignment. The judging module 423 is connected with the sensing chip 31. According to the image, the judging module 423 judge whether the optical properties and the structures of the optical lens 30 and the sensing chip 31 comply with the specifications. The operations of the alignment fixtures 421, the light source 422 and the judging module 423 will be described later.

Figure 8A:
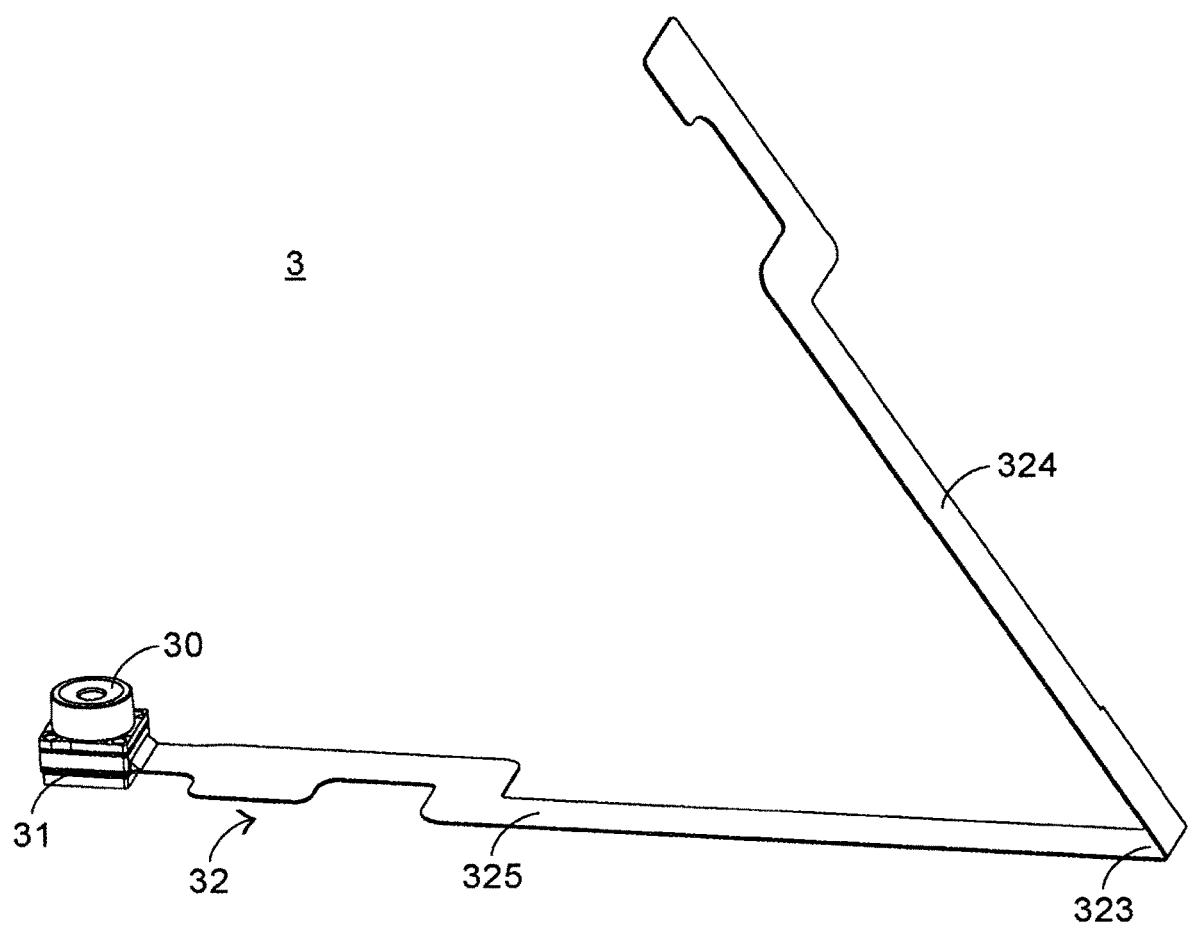
FIGS. 8A and 8B illustrate the step of bending a portion of the camera module according to the embodiment of the present invention.
Figure 8B:
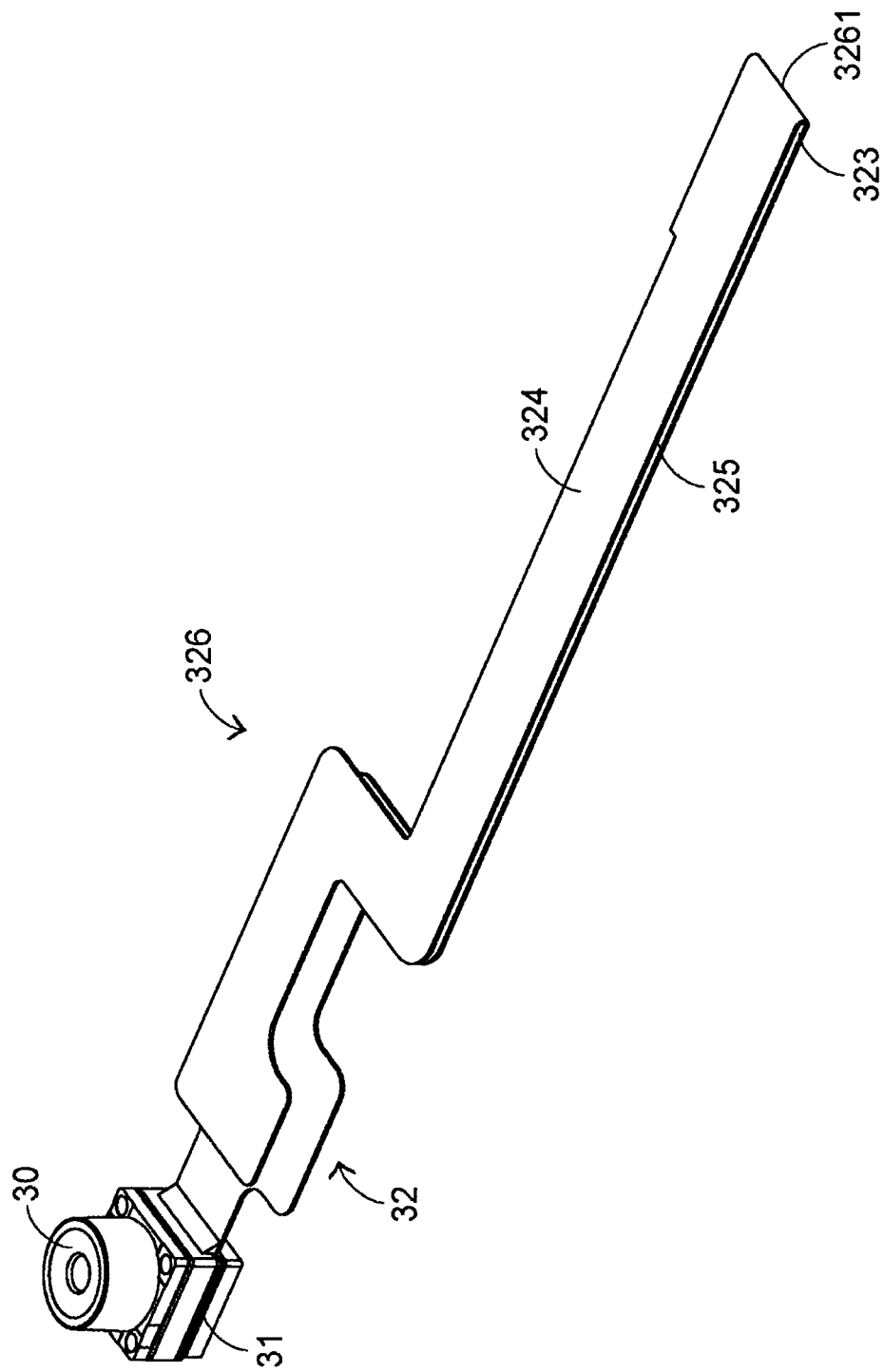

Hereinafter, an implementation example of the assembling method of the camera module will be illustrated with reference to FIGS. 4, 5, 6, 8A and 8B. FIGS. 8A and 8B illustrate the step of bending a portion of the camera module according to the embodiment of the present invention. For assembling the camera module 3, the step A is performed at first. That is, the sensing chip 31 is installed on the strip-like substrate 32. In the step A, the sensing chip 31 is fixed on the strip-like substrate 32 by a wire-bonding module (not shown) through a conductive film forming process. Then, the step B is performed. The strip-like substrate 32 is bent, and thus the bent substrate in the bent state is formed. The step B comprises steps B1 and B2. In the step B1, the strip-like substrate 32 is bent at the bendable segment 323 of the strip-like substrate 32. Meanwhile, the condition of the strip-like substrate 32 is shown in FIG. 8A. In the step B2, a first region 324 of the strip-like substrate 32 and a second region 325 of the strip-like substrate 32 are partially stacked on each other. Consequently, the bent substrate 326 is formed. The condition of the bent substrate 326 is shown in FIG. 8B. The length of the bent substrate 326 is smaller than the length of the strip-like substrate 32. In addition, the length of the bent substrate 326 is nearly equal to the length of the fastening table 41.

Figure 9:
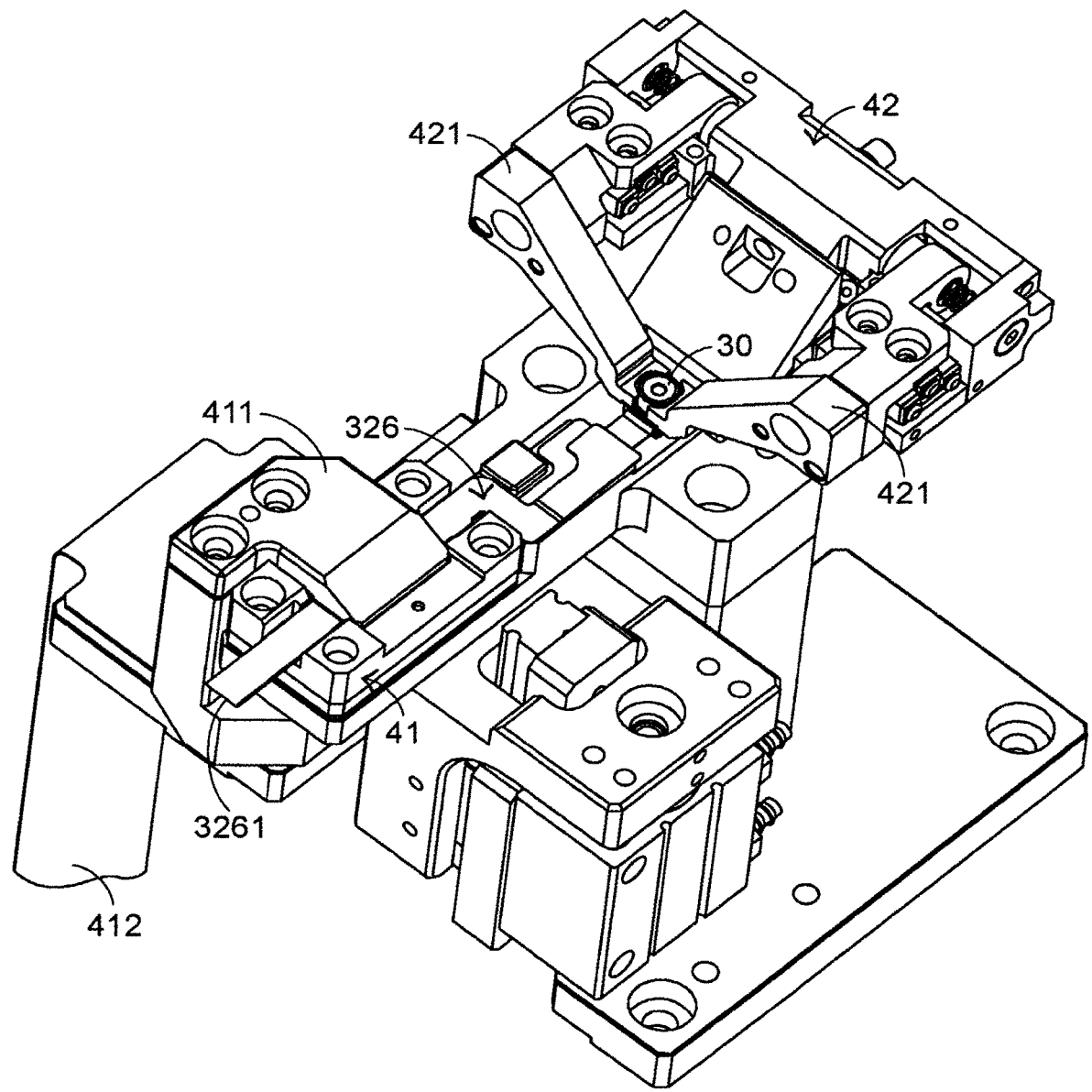
FIG. 9 is a schematic perspective view illustrating a portion of the assembling device and a portion of the camera module according to the embodiment of the present invention.

Please refer to FIGS. 5, 6 and 9. FIG. 9 is a schematic perspective view illustrating a portion of the assembling device and a portion of the camera module according to the embodiment of the present invention. After the bent substrate 326 is formed, the step C is performed. The bent substrate 326 and the optical lens 30 are placed on the fastening table 41 and the alignment module 42, respectively. The step C comprises steps C1, C2 and C3. In the step C1, the bent substrate 326 is placed on the fastening table 41. Meanwhile, an end 3261 of the bent substrate 326 is protruded out of the fastening table 41, and the end 3261 of the bent substrate 326 is disposed within a gap 40 between the fastening table 41 and the assembling device 4 (see FIG. 6). In the step C2, the bent substrate 326 is fixed by a fixing mechanism 411 of the fastening table 41, and the first electric connection part 322 of the bent substrate 326 is connected with a second connection part (not shown) of the fastening table 41. In the step C3, the optical lens 30 is placed on the alignment fixtures 421, and thus the optical lens 30 is located over the sensing chip 31. The fastening table 41 is connected with a power source (not shown) through a connecting cable 412. The bent substrate 326 can acquire the external electric power from the power source through the fastening table 41. In such way, the bent substrate 326 and the overlying sensing chip 31 can be normally operated.

After the bent substrate 326 and the optical lens 30 are placed in position, the step D is performed. The step D comprises steps D1, D2, D3, D4 and D5. In the D1, the installation angle of the optical lens 30 is adjusted by the alignment fixtures 421. In the step D2, the light source 422 emits a light beam, and the light beam is transmitted through the optical lens 30 and projected on the sensing chip 31 to generate an image. After the image is generated, the step D3 is performed. That is, the judging module 423 judges whether the image is qualified. If the judging module 423 judges that the image is qualified, it is determined that the active alignment of the optical lens 30 is completed (Step D4). Whereas, if the judging module 423 judges that the image is unqualified, the step D5 is performed to calculate the number of times the image is unqualified and judge whether the number of times the image is unqualified reaches a predetermined number. For example, the predetermined number is 3. If the number of times the image is unqualified is smaller than the predetermined number, the step D1 is repeatedly done. That is, the installation angle of the optical lens 30 is adjusted again. Whereas, if the number of times the image is unqualified is larger than or equal to the predetermined number, the step G is performed. Since the active alignment of the optical lens 30 is not successful, the optical lens 30 needs to be removed from the alignment module 42.

After the optical lens 30 is removed, the step H is performed. That is, the next optical lens (not shown) is placed on the alignment fixtures 421 of the alignment module 42. Consequently, the step D is performed to perform the active alignment on the next optical lens. After the active alignment on the optical lens 30 is completed, the step E is performed. The optical lens 30 and the bent substrate 326 are combined together. Consequently, the bent camera module is produced. Afterward, the step F is performed to restore the bent substrate 326 from the bent state to a non-bent state. Consequently, the camera module 3 is produced. Meanwhile, the assembling method of the camera module is completed.

The following three aspects should be specially described. Firstly, the step D is repeatedly performed until the active alignment of the optical lens is completed. Secondly, the bendable segment 323 of the strip-like substrate 32 is made of a flexible material. After the strip-like substrate 32 has been bent many times, the strip-like substrate 32 is not broken and the strip-like substrate 32 is still usable. Thirdly, the step F is performed manually or automatically (e.g., through a mechanical robot arm). That is, the way of performing the step F is not restricted.

From the above descriptions, the present invention provides the assembling method of the camera module. After the longer strip-like substrate is bent to be formed as the shorter bent substrate, the bent substrate is placed on the fastening table. Consequently, the active alignment on the optical lens is performed. After the active alignment is completed, the optical lens and the bent substrate are combined together. After the bent substrate is restored from the bent state to the non-bent state, the camera module completing the active alignment is produced. The assembling method of the present invention is capable of assembling the longer camera module in order to overcome the drawbacks of the conventional technologies.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An assembling method of a camera module, the assembling method comprising steps of:
   (A) installing a sensing chip on a strip-like substrate, wherein a length of the strip-like substrate is larger than a length of a fastening table;
   (B) bending the strip-like substrate, so that a bent substrate in a bent state is formed, wherein a length of the bent substrate is nearly equal to the length of the fastening table;
   (C) placing the bent substrate on the fastening table, and placing an optical lens on an alignment module of an assembling device;
   (D) adjusting an installation angle of the optical lens by the alignment module according to an active alignment;
   (E) combining the optical lens and the bent substrate together; and
   (F) allowing the bent substrate to be restored from the bent state to a non-bent state, so that the camera module is produced.

2. The assembling method according to claim 1, wherein in the step (A), the sensing chip is fixed on the strip-like substrate by a wire-bonding module through a conductive film forming process.

3. The assembling method according to claim 1, wherein the step (B) comprises steps of:
   (B1) bending the strip-like substrate at a bendable segment of the strip-like substrate; and
   (B2) allowing a first region of the strip-like substrate and a second region of the strip-like substrate to be partially stacked on each other, so that the bent substrate is formed.

4. The assembling method according to claim 1, wherein the step (C) comprises steps of:
   (C1) placing the bent substrate on the fastening table;
   (C2) fixing the bent substrate, and allowing a first electric connection part of the bent substrate to be connected with a second connection part of the fastening table; and
   (C3) placing the optical lens on an alignment fixture of the alignment module, so that the optical lens is located over the sensing chip.

5. The assembling method according to claim 4, wherein in the step (C1), an end of the bent substrate is protruded out of the fastening table, and the end of the bent substrate is disposed within a gap between the fastening table and the assembling device.

6. The assembling method according to claim 4, wherein after the step (C2), the fastening table is connected with a power source through a connecting cable, so that the bent substrate acquires external electric power from the power source through the fastening table.

7. The assembling method according to claim 1, wherein the step (D) comprises steps of:
   (D1) adjusting the installation angle of the optical lens;
   (D2) allowing a light source of the alignment module to emit a light beam, wherein after the light beam is transmitted through the optical lens, the light beam is projected on the sensing chip to generate an image; and
   (D3) judging whether the image is qualified.

8. The assembling method according to claim 7, wherein if a result of the step (D3) indicates that the image is qualified, it is determined that the active alignment of the optical lens is completed, wherein if the result of the step (D3) indicates that the image is not qualified, the installation angle of the optical lens is adjusted again.

9. The assembling method according to claim 8, wherein if the result of the step (D3) indicates that the image is not qualified again, the assembling method further comprises steps of:
   (G) determining that the active alignment of the optical lens is not successful, and removing the optical lens from the alignment module; and
   (H) placing a next optical lens on the alignment module.

* * * * *